(12) United States Patent
Perez et al.

(10) Patent No.: US 6,965,157 B1
(45) Date of Patent: Nov. 15, 2005

(54) SEMICONDUCTOR PACKAGE WITH EXPOSED DIE PAD AND BODY-LOCKING LEADFRAME

(75) Inventors: Erasmo Perez, Chandler, AZ (US); David T. Roman, Tempe, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 106 days.

(21) Appl. No.: 10/737,572

(22) Filed: Dec. 16, 2003

Related U.S. Application Data

(63) Continuation of application No. 09/436,158, filed on Nov. 9, 1999, now Pat. No. 6,847,103.

(51) Int. Cl.[7] .......................................... H01L 23/495
(52) U.S. Cl. ...................... 257/666; 257/787
(58) Field of Search ................ 257/666, 676, 257/787, 784

(56) References Cited

U.S. PATENT DOCUMENTS

| | | | |
|---|---|---|---|
| 2,596,993 A | 5/1952 | Gookin | |
| 3,435,815 A | 4/1969 | Forcier | |
| 3,734,660 A | 5/1973 | Davies et al. | |
| 3,838,984 A | 10/1974 | Crane et al. | |
| 4,054,238 A | 10/1977 | Lloyd et al. | |
| 4,189,342 A | 2/1980 | Kock | |
| 4,258,381 A | 3/1981 | Inaba | |
| 4,289,922 A | 9/1981 | Devlin | |
| 4,301,464 A | 11/1981 | Otsuki et al. | |
| 4,332,537 A | 6/1982 | Slepcevic | |
| 4,417,266 A | 11/1983 | Grabbe | |
| 4,451,224 A | 5/1984 | Harding | |
| 4,530,152 A | 7/1985 | Roche et al. | |
| 4,541,003 A | 9/1985 | Otsuka et al. | |
| 4,646,710 A | 3/1987 | Schmid et al. | |
| 4,707,724 A | 11/1987 | Suzuki et al. | |
| 4,727,633 A | 3/1988 | Herrick | |
| 4,737,839 A | 4/1988 | Burt | |
| 4,756,080 A | 7/1988 | Thorp, Jr. et al. | |
| 4,812,896 A | 3/1989 | Rothgery et al. | |
| 4,862,245 A | 8/1989 | Pashby et al. | |
| 4,862,246 A | 8/1989 | Masuda et al. | |
| 4,907,067 A | 3/1990 | Derryberry | |
| 4,916,519 A * | 4/1990 | Ward ........................ 257/666 |
| 4,920,074 A | 4/1990 | Shimizu et al. | |
| 4,935,803 A | 6/1990 | Kalfus et al. | |
| 4,942,454 A | 7/1990 | Mori et al. | |
| 4,987,475 A | 1/1991 | Schlesinger et al. | |
| 5,018,003 A | 5/1991 | Yasunaga | |
| 5,029,386 A | 7/1991 | Chao et al. | |
| 5,041,902 A | 8/1991 | McShane | |
| 5,057,900 A | 10/1991 | Yamazaki | |
| 5,059,379 A | 10/1991 | Tsutsumi et al. | |
| 5,065,223 A | 11/1991 | Matsuki et al. | |

(Continued)

FOREIGN PATENT DOCUMENTS

DE          19734794 A1          8/1997

(Continued)

Primary Examiner—S. V. Clark
(74) Attorney, Agent, or Firm—Stetina Brunda Garred & Brucker

(57) ABSTRACT

A very thin, small outline, thermally enhanced semiconductor package includes a leadframe that is coined to form locking features on an exposed die pad and on a plurality of extremely narrow, closely spaced leads. The coined features improve the mechanical locking between the leadframe and the plastic body of the package to increase their resistance to delamination and subsequent penetration by moisture, and enable reliable wire bonds to be made to the otherwise extremely narrow leads.

17 Claims, 5 Drawing Sheets

U.S. PATENT DOCUMENTS

| | | |
|---|---|---|
| 5,070,039 A | 12/1991 | Johnson et al. |
| 5,087,961 A | 2/1992 | Long et al. |
| 5,091,341 A | 2/1992 | Asada et al. |
| 5,096,852 A | 3/1992 | Hobson |
| 5,118,298 A | 6/1992 | Murphy |
| 5,151,039 A | 9/1992 | Murphy |
| 5,157,475 A | 10/1992 | Yamaguchi |
| 5,157,480 A | 10/1992 | McShane et al. |
| 5,168,368 A | 12/1992 | Gow, 3rd et al. |
| 5,172,213 A | 12/1992 | Zimmerman |
| 5,172,214 A | 12/1992 | Casto |
| 5,175,060 A | 12/1992 | Enomoto |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,218,231 A | 6/1993 | Kudo |
| 5,221,642 A | 6/1993 | Burns |
| 5,250,841 A | 10/1993 | Sloan et al. |
| 5,252,853 A | 10/1993 | Michii |
| 5,258,094 A | 11/1993 | Furui et al. |
| 5,266,834 A | 11/1993 | Nishi et al. |
| 5,273,938 A | 12/1993 | Lin et al. |
| 5,277,972 A | 1/1994 | Sakumoto et al. |
| 5,278,446 A | 1/1994 | Nagaraj et al. |
| 5,279,029 A | 1/1994 | Burns |
| 5,281,849 A | 1/1994 | Singh Deo et al. |
| 5,294,897 A | 3/1994 | Notani et al. |
| 5,327,008 A | 7/1994 | Djennas et al. |
| 5,332,864 A | 7/1994 | Liang et al. |
| 5,335,771 A | 8/1994 | Murphy |
| 5,336,931 A | 8/1994 | Juskey et al. |
| 5,343,076 A | 8/1994 | Katayama et al. |
| 5,358,905 A | 10/1994 | Chiu |
| 5,365,106 A | 11/1994 | Watanabe |
| 5,381,042 A | 1/1995 | Lerner et al. |
| 5,391,439 A | 2/1995 | Tomita et al. |
| 5,406,124 A | 4/1995 | Morita et al. |
| 5,410,180 A | 4/1995 | Fujii et al. |
| 5,414,299 A | 5/1995 | Wang et al. |
| 5,424,576 A | 6/1995 | Djennas et al. |
| 5,428,248 A | 6/1995 | Cha |
| 5,435,057 A | 7/1995 | Bindra et al. |
| 5,444,301 A | 8/1995 | Song et al. |
| 5,452,511 A | 9/1995 | Chang |
| 5,454,905 A | 10/1995 | Fogelson |
| 5,474,958 A | 12/1995 | Djennas et al. |
| 5,484,274 A | 1/1996 | Neu |
| 5,493,151 A | 2/1996 | Asada et al. |
| 5,508,556 A | 4/1996 | Lin |
| 5,517,056 A | 5/1996 | Bigler et al. |
| 5,521,429 A | 5/1996 | Aono et al. |
| 5,528,076 A | 6/1996 | Pavio |
| 5,534,467 A | 7/1996 | Rostoker |
| 5,539,251 A | 7/1996 | Iverson et al. |
| 5,543,657 A | 8/1996 | Diffenderfer et al. |
| 5,544,412 A | 8/1996 | Romero et al. |
| 5,545,923 A | 8/1996 | Barber |
| 5,581,122 A | 12/1996 | Chao et al. |
| 5,592,019 A | 1/1997 | Ueda et al. |
| 5,592,025 A | 1/1997 | Clark et al. |
| 5,594,274 A | 1/1997 | Suetaki |
| 5,595,934 A | 1/1997 | Kim |
| 5,604,376 A | 2/1997 | Hamburgen et al. |
| 5,608,265 A | 3/1997 | Kitano et al. |
| 5,608,267 A | 3/1997 | Mahulikar et al. |
| 5,625,222 A | 4/1997 | Yoneda et al. |
| 5,633,528 A | 5/1997 | Abbott et al. |
| 5,639,990 A | 6/1997 | Nishihara et al. |
| 5,640,047 A | 6/1997 | Nakashima |
| 5,641,997 A | 6/1997 | Ohta et al. |
| 5,643,433 A | 7/1997 | Fukase et al. |
| 5,644,169 A | 7/1997 | Chun |
| 5,646,831 A | 7/1997 | Manteghi |
| 5,650,663 A | 7/1997 | Parthasarathi |
| 5,661,088 A | 8/1997 | Tessier et al. |
| 5,663,593 A * | 9/1997 | Mostafazadeh et al. ..... 257/666 |
| 5,665,996 A | 9/1997 | Williams et al. |
| 5,673,479 A | 10/1997 | Hawthorne |
| 5,683,806 A | 11/1997 | Sakumoto et al. |
| 5,689,135 A | 11/1997 | Ball |
| 5,696,666 A | 12/1997 | Miles et al. |
| 5,701,034 A | 12/1997 | Marrs |
| 5,703,407 A | 12/1997 | Hori |
| 5,710,064 A | 1/1998 | Song et al. |
| 5,723,899 A | 3/1998 | Shin |
| 5,724,233 A | 3/1998 | Honda et al. |
| 5,726,493 A | 3/1998 | Yamashita et al. |
| 5,736,432 A | 4/1998 | Mackessy |
| 5,745,984 A | 5/1998 | Cole, Jr. et al. |
| 5,753,532 A | 5/1998 | Sim |
| 5,753,977 A | 5/1998 | Kusaka et al. |
| 5,766,972 A | 6/1998 | Takahashi et al. |
| 5,770,888 A | 6/1998 | Song et al. |
| 5,776,798 A | 7/1998 | Quan et al. |
| 5,783,861 A | 7/1998 | Son |
| 5,801,440 A | 9/1998 | Chu et al. |
| 5,814,877 A | 9/1998 | Diffenderfer et al. |
| 5,814,881 A | 9/1998 | Alagaratnam et al. |
| 5,814,883 A | 9/1998 | Sawai et al. |
| 5,814,884 A | 9/1998 | Davis et al. |
| 5,817,540 A | 10/1998 | Wark |
| 5,818,105 A | 10/1998 | Kouda |
| 5,821,457 A | 10/1998 | Mosley et al. |
| 5,821,615 A | 10/1998 | Lee |
| 5,834,830 A | 11/1998 | Cho |
| 5,835,988 A | 11/1998 | Ishii |
| 5,844,306 A | 12/1998 | Fujita et al. |
| 5,856,911 A | 1/1999 | Riley |
| 5,859,471 A | 1/1999 | Kuraishi et al. |
| 5,866,939 A | 2/1999 | Shin et al. |
| 5,871,782 A | 2/1999 | Choi |
| 5,874,784 A | 2/1999 | Aoki et al. |
| 5,877,043 A | 3/1999 | Alcoe et al. |
| 5,886,397 A | 3/1999 | Ewer |
| 5,886,398 A | 3/1999 | Low et al. |
| 5,894,108 A | 4/1999 | Mostafazadeh et al. |
| 5,897,339 A | 4/1999 | Song et al. |
| 5,900,676 A | 5/1999 | Kweon et al. |
| 5,903,049 A | 5/1999 | Mori |
| 5,903,050 A | 5/1999 | Thurairajaratnam et al. |
| 5,909,053 A | 6/1999 | Fukase et al. |
| 5,915,998 A | 6/1999 | Stidham et al. |
| 5,917,242 A | 6/1999 | Ball |
| 5,939,779 A | 8/1999 | Kim |
| 5,942,794 A | 8/1999 | Okumura et al. |
| 5,951,305 A | 9/1999 | Haba |
| 5,959,356 A | 9/1999 | Oh |
| 5,969,426 A | 10/1999 | Baba et al. |
| 5,973,388 A * | 10/1999 | Chew et al. ................. 257/676 |
| 5,976,912 A | 11/1999 | Fukutomi et al. |
| 5,977,613 A | 11/1999 | Takata et al. |
| 5,977,615 A | 11/1999 | Yamaguchi et al. |
| 5,977,630 A | 11/1999 | Woodworth et al. |
| 5,981,314 A | 11/1999 | Glenn et al. |
| 5,986,333 A | 11/1999 | Nakamura |
| 5,986,885 A | 11/1999 | Wyland |
| 6,001,671 A | 12/1999 | Fjelstad |
| 6,013,947 A | 1/2000 | Lim |
| 6,018,189 A | 1/2000 | Mizuno |
| 6,020,625 A | 2/2000 | Qin et al. |
| 6,025,640 A | 2/2000 | Yagi et al. |
| 6,031,279 A | 2/2000 | Lenz |
| RE36,613 E | 3/2000 | Ball |

| Patent No. | Kind | Date | Inventor(s) | Class |
|---|---|---|---|---|
| 6,034,423 A * | | 3/2000 | Mostafazadeh et al. | 257/691 |
| 6,040,626 A | | 3/2000 | Cheah et al. | |
| 6,043,430 A | | 3/2000 | Chun | |
| 6,060,768 A | | 5/2000 | Hayashida et al. | |
| 6,060,769 A | | 5/2000 | Wark | |
| 6,072,228 A | | 6/2000 | Hinkle et al. | |
| 6,075,284 A | | 6/2000 | Choi et al. | |
| 6,081,029 A | | 6/2000 | Yamaguchi | |
| 6,084,310 A | | 7/2000 | Mizuno et al. | |
| 6,087,715 A | | 7/2000 | Sawada et al. | |
| 6,087,722 A | | 7/2000 | Lee et al. | |
| 6,100,594 A | | 8/2000 | Fukui et al. | |
| 6,113,473 A | | 9/2000 | Costantini et al. | |
| 6,114,752 A | | 9/2000 | Huang et al. | |
| 6,118,174 A | | 9/2000 | Kim | |
| 6,118,184 A | | 9/2000 | Ishio et al. | |
| RE36,907 E | | 10/2000 | Templeton, Jr. et al. | |
| 6,130,115 A | | 10/2000 | Okumura et al. | |
| 6,130,473 A | | 10/2000 | Mostafazadeh et al. | |
| 6,133,623 A | | 10/2000 | Otsuki et al. | |
| 6,140,154 A | | 10/2000 | Hinkle et al. | |
| 6,143,981 A | | 11/2000 | Glenn | |
| 6,169,329 B1 | | 1/2001 | Farnworth et al. | |
| 6,175,150 B1 * | | 1/2001 | Ichikawa et al. | 257/676 |
| 6,177,718 B1 | | 1/2001 | Kozono | |
| 6,181,002 B1 | | 1/2001 | Juso et al. | |
| 6,184,465 B1 | | 2/2001 | Corisis | |
| 6,184,573 B1 | | 2/2001 | Pu | |
| 6,194,777 B1 | | 2/2001 | Abbott et al. | |
| 6,197,615 B1 | | 3/2001 | Song et al. | |
| 6,198,171 B1 | | 3/2001 | Huang et al. | |
| 6,201,186 B1 | | 3/2001 | Daniels et al. | |
| 6,201,292 B1 | | 3/2001 | Yagi et al. | |
| 6,204,554 B1 | | 3/2001 | Ewer et al. | |
| 6,208,020 B1 | | 3/2001 | Minamio et al. | |
| 6,208,021 B1 | | 3/2001 | Ohuchi et al. | |
| 6,208,023 B1 | | 3/2001 | Nakayama et al. | |
| 6,211,462 B1 | | 4/2001 | Carter, Jr. et al. | |
| 6,218,731 B1 | | 4/2001 | Huang et al. | |
| 6,222,258 B1 | | 4/2001 | Asano et al. | |
| 6,222,259 B1 | | 4/2001 | Park et al. | |
| 6,225,146 B1 | | 5/2001 | Yamaguchi et al. | |
| 6,229,200 B1 | | 5/2001 | Mclellan et al. | |
| 6,229,205 B1 | | 5/2001 | Jeong et al. | |
| 6,239,367 B1 | | 5/2001 | Hsuan et al. | |
| 6,239,384 B1 | | 5/2001 | Smith et al. | |
| 6,242,281 B1 | | 6/2001 | Mclellan et al. | |
| 6,256,200 B1 | | 7/2001 | Lam et al. | |
| 6,258,629 B1 | | 7/2001 | Niones et al. | |
| 6,281,566 B1 | | 8/2001 | Magni | |
| 6,281,568 B1 | | 8/2001 | Glenn et al. | |
| 6,282,095 B1 | | 8/2001 | Houghton et al. | |
| 6,285,075 B1 | | 9/2001 | Combs et al. | |
| 6,291,271 B1 | | 9/2001 | Lee et al. | |
| 6,291,273 B1 | | 9/2001 | Miyaki et al. | |
| 6,294,100 B1 | | 9/2001 | Fan et al. | |
| 6,294,830 B1 | | 9/2001 | Fjelstad | |
| 6,295,977 B1 | | 10/2001 | Ripper et al. | |
| 6,297,548 B1 | | 10/2001 | Moden et al. | |
| 6,303,984 B1 | | 10/2001 | Corisis | |
| 6,303,997 B1 | | 10/2001 | Lee | |
| 6,307,272 B1 | | 10/2001 | Takahashi et al. | |
| 6,309,909 B1 | | 10/2001 | Ohgiyama | |
| 6,316,822 B1 | | 11/2001 | Venkateshwaran et al. | |
| 6,316,838 B1 | | 11/2001 | Ozawa et al. | |
| 6,323,550 B1 | | 11/2001 | Martin et al. | |
| 6,326,243 B1 | | 12/2001 | Suzuya et al. | |
| 6,326,244 B1 | | 12/2001 | Brooks et al. | |
| 6,326,678 B1 | | 12/2001 | Karnezos et al. | |
| 6,335,564 B1 | | 1/2002 | Pour | |
| 6,337,510 B1 | | 1/2002 | Chun-Jen et al. | |
| 6,339,255 B1 | | 1/2002 | Shin | |
| 6,348,726 B1 | | 2/2002 | Bayan et al. | |
| 6,355,502 B1 | | 3/2002 | Kang et al. | |
| 6,369,447 B2 | | 4/2002 | Mori | |
| 6,369,454 B1 | | 4/2002 | Chung | |
| 6,373,127 B1 | | 4/2002 | Baudouin et al. | |
| 6,380,048 B1 | | 4/2002 | Boon et al. | |
| 6,384,472 B1 | | 5/2002 | Huang | |
| 6,388,311 B1 * | | 5/2002 | Nakashima et al. | 257/676 |
| 6,388,336 B1 | | 5/2002 | Venkateshwaran et al. | |
| 6,395,578 B1 | | 5/2002 | Shin et al. | |
| 6,400,004 B1 | | 6/2002 | Fan et al. | |
| 6,410,979 B2 | | 6/2002 | Abe | |
| 6,414,385 B1 | | 7/2002 | Huang et al. | |
| 6,420,779 B1 | | 7/2002 | Sharma et al. | |
| 6,429,508 B1 | | 8/2002 | Gang | |
| 6,437,429 B1 * | | 8/2002 | Su et al. | 257/666 |
| 6,444,499 B1 | | 9/2002 | Swiss et al. | |
| 6,448,633 B1 * | | 9/2002 | Yee et al. | 257/666 |
| 6,452,279 B2 | | 9/2002 | Shimoda | |
| 6,459,148 B1 | | 10/2002 | Chun-Jen et al. | |
| 6,464,121 B2 | | 10/2002 | Reijnders | |
| 6,476,469 B2 | | 11/2002 | Huang et al. | |
| 6,476,474 B1 | | 11/2002 | Hung | |
| 6,482,680 B1 | | 11/2002 | Khor et al. | |
| 6,498,099 B1 | | 12/2002 | McLellan et al. | |
| 6,498,392 B2 | | 12/2002 | Azuma | |
| 6,507,096 B2 | | 1/2003 | Gang | |
| 6,507,120 B2 | | 1/2003 | Lo et al. | |
| 6,534,849 B1 | | 3/2003 | Gang | |
| 6,545,332 B2 | | 4/2003 | Huang | |
| 6,545,345 B1 | | 4/2003 | Glenn et al. | |
| 6,559,525 B2 | | 5/2003 | Huang | |
| 6,566,168 B2 | | 5/2003 | Gang | |
| 6,583,503 B2 | | 6/2003 | Akram et al. | |
| 6,667,546 B2 | | 12/2003 | Huang et al. | |
| 6,713,849 B2 * | | 3/2004 | Hasebe et al. | 257/667 |
| 2001/0008305 A1 | | 7/2001 | McLellan et al. | |
| 2001/0014538 A1 | | 8/2001 | Kwan et al. | |
| 2002/0011654 A1 | | 1/2002 | Kimura | |
| 2002/0027297 A1 | | 3/2002 | Ikenaga et al. | |
| 2002/0140061 A1 | | 10/2002 | Lee | |
| 2002/0140068 A1 | | 10/2002 | Lee et al. | |
| 2002/0163015 A1 | | 11/2002 | Lee et al. | |
| 2003/0030131 A1 | | 2/2003 | Lee et al. | |
| 2003/0073265 A1 | | 4/2003 | Hu et al. | |

FOREIGN PATENT DOCUMENTS

| | | |
|---|---|---|
| EP | 5421117 | 6/1979 |
| EP | 5950939 | 3/1984 |
| EP | 0393997 | 10/1990 |
| EP | 0459493 | 12/1991 |
| EP | 0720225 | 3/1996 |
| EP | 0720234 | 3/1996 |
| EP | 0794572 A2 | 10/1997 |
| EP | 0844665 | 5/1998 |
| EP | 0936671 | 8/1999 |
| EP | 098968 | 3/2000 |
| EP | 1032037 | 8/2000 |
| JP | 55163868 | 12/1980 |
| JP | 5745959 | 3/1982 |
| JP | 58160095 | 8/1983 |
| JP | 59208756 | 11/1984 |
| JP | 59227143 | 12/1984 |
| JP | 60010756 | 1/1985 |
| JP | 60116239 | 8/1985 |
| JP | 60195957 | 10/1985 |
| JP | 60231349 | 11/1985 |
| JP | 6139555 | 2/1986 |
| JP | 629639 | 1/1987 |
| JP | 63067762 | 3/1988 |
| JP | 63205935 | 8/1988 |
| JP | 63233555 | 9/1988 |
| JP | 63249345 | 10/1988 |

| | | | | | | |
|---|---|---|---|---|---|---|
| JP | 63316470 | 12/1988 | | JP | 98205 | 1/1997 |
| JP | 64054749 | 3/1989 | | JP | 98206 | 1/1997 |
| JP | 1106456 | 4/1989 | | JP | 98207 | 1/1997 |
| JP | 1175250 | 7/1989 | | JP | 992775 | 4/1997 |
| JP | 1205544 | 8/1989 | | JP | 9293822 | 11/1997 |
| JP | 1251747 | 10/1989 | | JP | 10022447 | 1/1998 |
| JP | 3177060 | 8/1991 | | JP | 10163401 | 6/1998 |
| JP | 4098864 | 9/1992 | | JP | 10199934 | 7/1998 |
| JP | 5129473 | 5/1993 | | JP | 10256240 | 9/1998 |
| JP | 5166992 | 7/1993 | | JP | 00150765 | 5/2000 |
| JP | 5283460 | 10/1993 | | JP | 556398 | 10/2000 |
| JP | 692076 | 4/1994 | | JP | 2001060648 | 3/2001 |
| JP | 6140563 | 5/1994 | | JP | 200204397 | 8/2002 |
| JP | 6260532 | 9/1994 | | KR | 941979 | 1/1994 |
| JP | 7297344 | 11/1995 | | KR | 9772358 | 11/1997 |
| JP | 7312405 | 11/1995 | | KR | 100220154 | 6/1999 |
| JP | 864634 | 3/1996 | | KR | 0049944 | 6/2002 |
| JP | 8083877 | 3/1996 | | WO | 9956316 | 11/1999 |
| JP | 8125066 | 5/1996 | | WO | 9967821 | 12/1999 |
| JP | 8222682 | 8/1996 | | | | |
| JP | 8306853 | 11/1996 | | | | |

* cited by examiner

SEMICONDUCTOR PACKAGE WITH EXPOSED DIE PAD AND BODY-LOCKING LEADFRAME

RELATED APPLICATION

The present application is a continuation of U.S. application Ser. No. 09/436,158 entitled SEMICONDUCTOR PACKAGE WITH EXPOSED DIE PAD AND BODY-LOCKING LEADFRAME, filed Nov. 9, 1999 U.S. Pat. No. 6,847,103.

BACKGROUND

1. Field of the Invention

This invention relates to packaging of semiconductors in general, and in particular, to a very thin, small outline, thermally enhanced semiconductor package having a coined leadframe that provides a die pad with an exposed surface and features that lock the leadframe more securely to the plastic body of the package.

2. Description of the Related Art

Integrated circuits ("ICs") are formed on a single die, or "chip," cut from a semiconductor wafer containing a large number of identical dies. The dies are relatively small and fragile, are susceptible to harmful environmental elements, particularly moisture, and generate a relatively large amount of heat in a relatively small volume during operation. Accordingly, ICs must be packaged in affordable, yet robust packages that protect them from the environment, enable them to be reliably mounted to and interconnected with, for example, a printed circuit board ("PCB") populated with associated electronic components, and to effectively dissipate the heat they generate during operation.

Leadframe types of semiconductor packages are well known and widely used in the electronics industry to house, mount, and interconnect a variety of ICs. A conventional leadframe is typically die-stamped from a sheet of flat-stock metal, and includes a plurality of metal leads temporarily held together in a planar arrangement about a central region during package manufacture by a rectangular frame comprising a plurality of expendable "dam-bars." A mounting pad for a semiconductor die is supported in the central region by "tie-bars" that attach to the frame. The leads extend from a first end integral with the frame to an opposite second end adjacent to, but spaced apart from, the die pad.

During package manufacture, an IC die is attached to the die pad. Wire-bonding pads on the die are then connected to selected ones of the inner ends of the leads by fine, conductive bonding wires to convey power, ground, and signals between the die and the leads.

A protective body of an epoxy resin is molded over the assembly to enclose and seal the die, the inner ends of the leads, and the wire bonds against harmful environmental elements. The rectangular frame and the outer ends of the leads are left exposed outside of the body, and after molding, the frame is cut away from the leads and discarded, and the outer ends of the leads are appropriately formed for interconnection of the package with other, associated componentry.

In a variant of the above configuration, viz., a "land grid array" ("LGA"), or a "leadless chip carrier" ("LCC") package, the outer portions of the leads are removed entirely from the package, and a terminal, or "land," is provided on the lower surface of the leads and exposed through the lower surface of the body for mounting and inter-connection of the package to a PCB. In yet another variation, the die pad is "down-set" relative to the plane of the leads such that its lower surface is exposed through the lower surface of the body for enhanced dissipation of heat from the die.

While the foregoing prior art package configurations provide a reasonable compromise between packaging cost and performance, they also include some recognized problem areas where there is a long-felt need for improvement. One of these relates to the problem of making reliable wire bonds to leads that have been made extremely narrow to accommodate an extremely fine lead pitch. In particular, as package sizes decrease, lead densities remain the same or even increase. In response, leads are made much narrower so that they can be placed closer together. At some limiting width and pitch of the leads, the leads become so narrow and close together that it is difficult to make wire bonds to them reliably. It is therefore desirable to provide a leadframe design that can accommodate very narrow, closely pitched leads, yet one in which reliable wire bonds can be made to the leads.

Another problem relates to delamination of the leadframe components from the plastic package body, and the attendant problem of penetration of the package by moisture. In particular, the various parts of a semiconductor package experience greatly different amounts of thermal expansion and contraction with temperature changes due to the relatively large differences in the coefficients of thermal expansion of their respective materials, e.g., metal, epoxy resin, and silicon.

As a result, the leadframe components can become delaminated from the package body with temperature cycling of the package during manufacture or operation. Where delamination occurs at a boundary of the package body, a microscopic crack is created for the penetration of the package by moisture. This penetration can wreak a two-fold assault on the package: First, the moisture can corrode any metallizations present in its path, resulting in subsequent current leakage through the corrosive path; second, the moisture can expand and contract with temperature cycling of the package, resulting in further propagation of the cracks into the package, and hence, further penetration of the package by moisture. It is therefore desirable to provide a leadframe design that more securely locks the leadframe components to the plastic body of the package, thereby effectively reducing both the amount of delamination of the leadframe from the body and the resulting penetration of the body by moisture.

BRIEF SUMMARY OF THE INVENTION

The present invention includes a very thin, small outline, thermally enhanced semiconductor package having a leadframe that provides locking features on a plurality of extremely narrow, closely spaced leads and on an exposed die pad to improve mechanical locking between the leadframe and the plastic body of the package. The improved locking reduces the incidence of delamination between the leadframe and the package body and increases the resistance of the package to penetration by moisture.

The novel leadframe is made by patterning a metal plate to form: a rectangular frame around a periphery of the plate; a plurality of leads, each having an outer end integral with the frame and an inner end extending toward a central region of the frame; and a die pad disposed in the central region of the frame and adjacent to the inner ends of the leads. The die pad is attached to the frame or to two or more of the leads by two or more tie-bars.

A locking pad is coined into an outer end portion of each lead adjacent to the frame, a wire bonding pad is coined into an inner end portion of each lead adjacent to the die pad, and a recessed shoulder is coined into the lower surface of the die pad around a central portion thereof. The bonding pads increase the area of the leads adjacent to the die pad to enable reliable wire bonds to be made to the leads. The locking pads, bonding pads and recessed shoulder provide locking steps in the leadframe and increase the area of adhesion between the leadframe an over-molded plastic body to lock the two together more securely and increase their resistance to delamination and the subsequent penetration of the package by moisture. A mounting and interconnection land is defined on the lower surface of each lead between the locking pad on its outer end and the bonding pad on its inner end.

A semiconductor package is formed on the leadframe by attaching a semiconductor die to the upper surface of the die pad, wire-bonding the die to selected ones of the bonding pads, and molding a body of an insulative plastic over the die, the die pad, and the leads such that the locking pads, the bonding pads and the recessed shoulder on the lower surface of the die pad are covered by and interlock with the plastic body. The rectangular frame is exposed at a lateral periphery of the body for its subsequent removal, and the lands and the central portion of the lower surface of the die pad are exposed through a lower surface of the body for their subsequent attachment to a PCB.

A better understanding of the present invention may be had from a consideration of the detailed description below, particularly if such consideration is made in conjunction with the drawings.

DETAILED DESCRIPTION OF THE INVENTION

Figures 1, 2, 3:
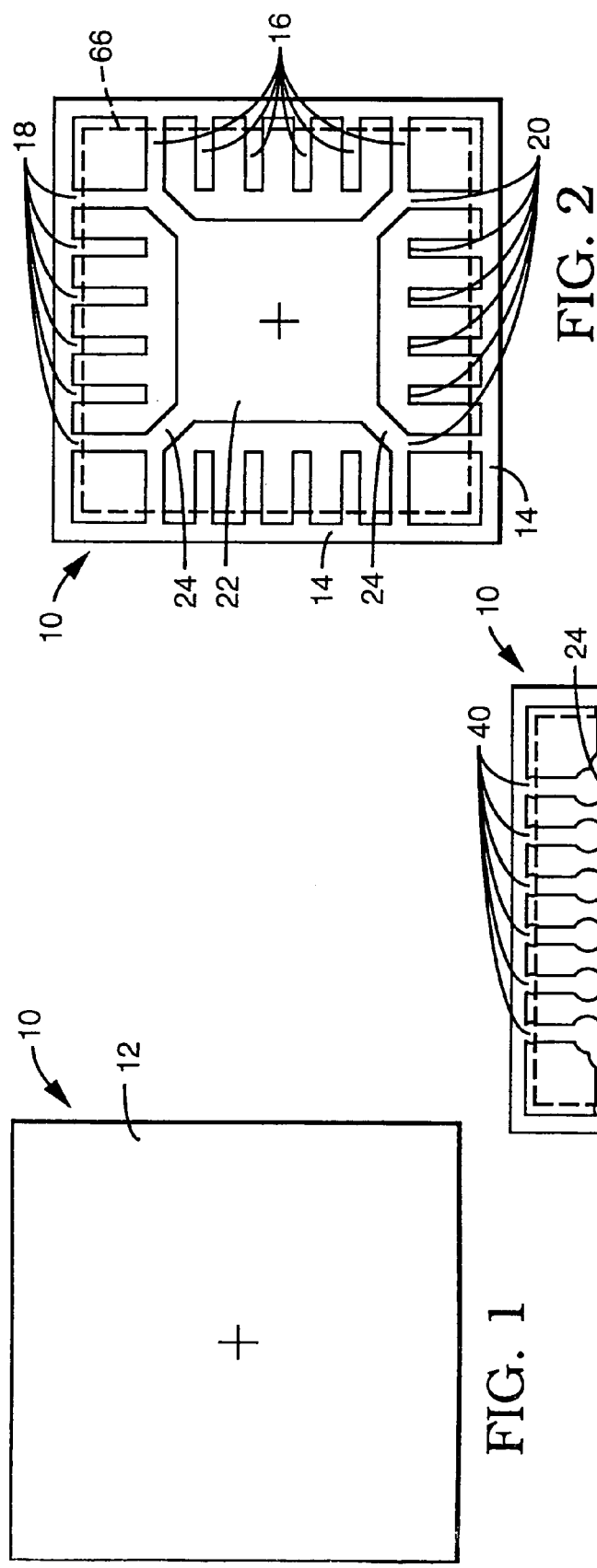
FIG. 1 is a plan view of a ductile metal plate from which the leadframe of the present invention is etched.
FIG. 2 is a plan view of the leadframe of the present invention resulting from the etching of the plate shown in FIG. 1.
FIGS. 3 and 4 are top and bottom plan views, respectively, of the leadframe of the present invention after coining of the leadframe shown in FIG. 2.

FIGS. 1–5 show in plan view the sequential fabrication and partial assembly of one embodiment of the novel leadframe 10 of the present invention. Fabrication of the leadframe begins with the provision of a thin, polygonal plate 12 of a ductile metal (FIG. 1), which is then patterned to form the nascent leadframe 10 (FIG. 2).

In the exemplary square embodiment illustrated in FIG. 1, the plate 12 is about 0.254 millimeters ("mm") thick, about 4 mm on a side, and made of a copper alloy. Other metals suitable for use in the leadframe 10 include aluminum and iron-nickel (Kovar) alloys.

FIG. 2 is a top plan view of the leadframe 10 patterned from the plate 12 shown in FIG. 1. The leadframe 10 comprises a rectangular frame 14 defined around a periphery of the plate 12; a plurality of leads 16, each having an outer end portion 18 integral with the frame 14 and an inner end portion 20 extending toward a central region of the frame, the center of which is marked by a cross; and, a die pad 22 disposed in the central region of the frame and adjacent to the inner ends of the leads. In the embodiment illustrated, the die pad 22 is attached directly to the frame 14 by two or more tie-bars 24, or indirectly through two or more of the leads 16, as shown in FIG. 2.

In the exemplary embodiment illustrated in FIG. 2, the leads 16 are about 0.178 mm wide, about 0.254 mm long, and spaced at a pitch of about 0.500 mm. The die pad 22 is about 2.120 mm on a side. The leadframe 10 can be patterned from the plate 12 by, e.g., die-stamping, etching, using photolithography techniques, electrical discharge machining ("EDM"), or by laser-beam cutting.

Those of skill in the art will recognize the difficulty of making reliable wire bonds to the very narrow, closely pitched leads 16. To overcome this problem, and to provide features on the leadframe 10 for more effectively locking the leadframe to a plastic package body 66 (shown as broken outline in FIGS. 2–5) molded over it, the leadframe is subjected to a coining process, which is illustrated in an enlarged cross-sectional view in FIG. 6.

Figure 6:
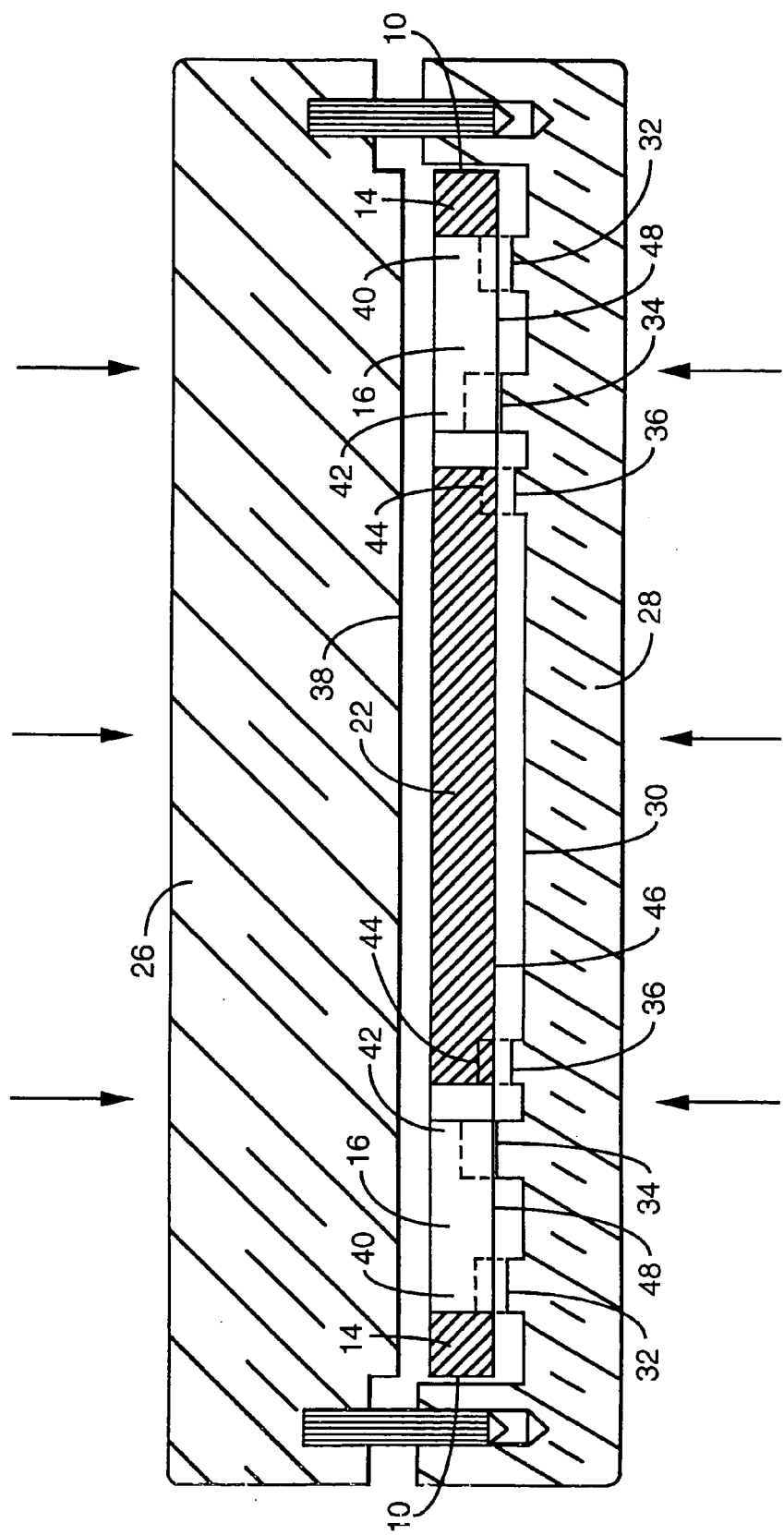
FIG. 6 is a cross-sectional, elevation view of the leadframe of the present invention disposed between the inner faces of two coining dies.

As shown in FIG. 6, after patterning, the planar leadframe 10 is placed between the opposing faces of an upper coining die 26 and a lower coining die 28. The upper face 30 of the lower die 28 includes three raised surfaces 32, 34, 36 that, in a plan view (not illustrated) comprise three concentric rectangles. The opposing lower face 38 of the upper die 26 is substantially flat.

Since the metal of the leadframe 10 is substantially incompressible, the effect of the local coining forces exerted by the dies on a given volume of the metal is to displace the metal laterally wherever such flow is unrestricted, i.e., its thickness is decreased, its length and/or width is increased, while its volume remains the same.

Thus, when the two dies 26, 28 are brought together forcefully in the direction of the arrows shown, the raised surface 32 coins a locking pad 40 into the outer end portion 18 of each lead 16 adjacent to the frame 14; the raised surface 34 coins a bonding pad 42 into the inner end portion 20 of each lead 16 adjacent to the die pad 22; and, the raised surface 36 coins a recess shoulder 44 into the lower surface of the die pad 22 around a central portion 46 thereof. A mounting and interconnection land 48 is also defined on the lower surface of each lead 16 between the locking pad 40 on its outer end 18 and the bonding pad 42 on its inner end 20.

Figure 4:
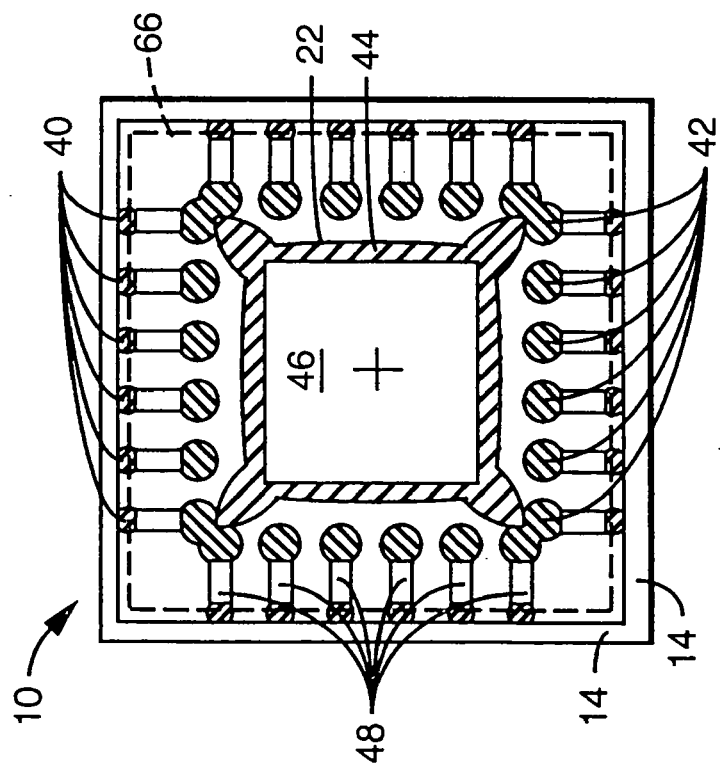
Figure 7:
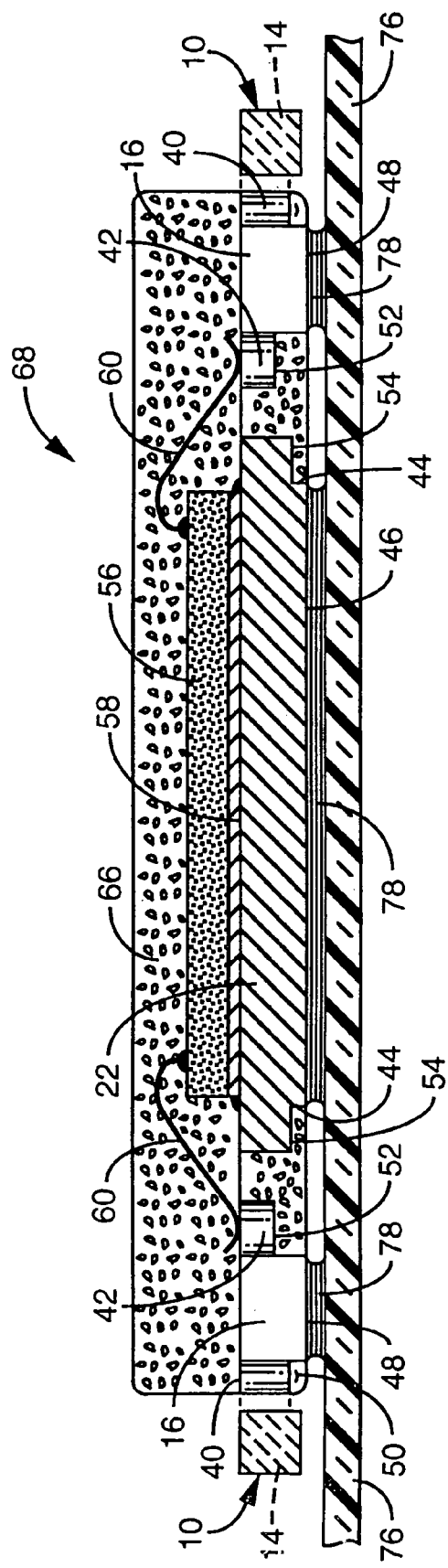
FIG. 7 is a cross-sectional, elevation view of one embodiment of a semiconductor package in accordance with the present invention, shown mounted to a PCB.

FIGS. 3 and 4 are top and bottom plan views, respectively, of the leadframe 10 after coining, and show the spatulate locking pads 40 and bonding pads 42 on the opposite ends of the respective leads 16, and the recessed shoulder 44 on the die pad 22, resulting from the coining process. An enlarged cross-sectional view of the coined leadframe 10 is shown in FIG. 7.

It will be noted that the upper surface of the leadframe 10 remains substantially planar after coining, whereas, the lower surface of the leadframe comprises a plurality of stepped, or recessed, plateaus where coining has taken place, as shown by the cross-hatched areas in FIG. 4. In the particular embodiment illustrated in the figures, the lower surfaces 50 of the locking pads 40 are coined to a depth of about 0.076 mm, the lower surfaces 52 of the bonding pads 42 are coined to a depth of about 0.127 mm, and the lower surface 54 of the recessed shoulder 44 is coined to a depth of about 0.051 mm.

The plurality of steps created in the leads 16 and the die pad 22 by these recessed surfaces, combined with the increased adhesion area of the surfaces defining them, act as "keys" to more effectively lock the leadframe 10 into a surrounding body of plastic and thereby resist delamination between the two. This increased adhesion also increases the resistance of the package to the propagation of cracks from an exterior boundary of the package, and hence, a subsequent penetration of the package by moisture. Additionally, the bonding pads 42 effectively enlarge the inner end portions 20 of the leads 16 immediately adjacent to the die pad 22 so that reliable wire bonds can easily be made to the otherwise extremely narrow leads.

Figure 5:
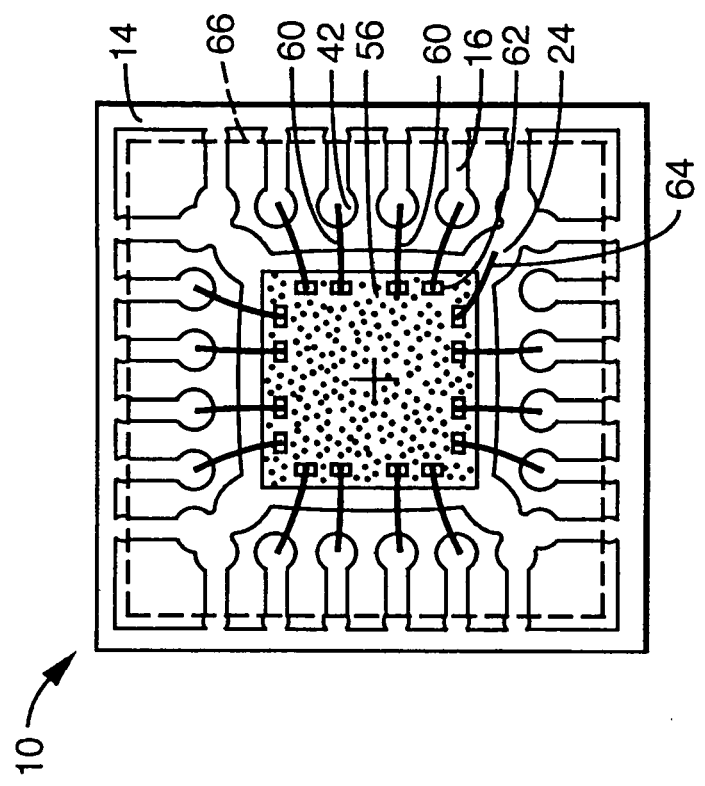
FIG. 5 is a top plan view of the leadframe seen in FIG. 3 showing the attachment of a semiconductor die thereto.

FIG. 5 illustrates the attachment of a semiconductor die 56 to the upper surface of the die pad 22. The die 56 may be attached with a layer of an adhesive 58 (see FIG. 7), a layer of a double-backed adhesive tape, or by soldering it to the die pad. The die 56 is electrically connected to the leads 16 by a plurality of conductive wires 60 bonded at opposite ends to contact pads 62 on a top surface of the die and selected ones of the bonding pads 42 on the leads, respectively (see FIG. 5). The wire bonding can be effected using either ultrasonic or thermo-compression bonding techniques. It may be noted that the bonding pads 42 on the leads 16 connected to the tie-bars 24 make ample provision for the "down-bonding" of grounding wires 64 from the die 56 to the die pad 22.

After the die 56 has been attached to the die pad 22 and wire bonded to the leads 16, the leadframe 10 is placed in the cavity of a clam-shell mold (not illustrated), and a molten, insulative plastic, e.g., an epoxy resin, is injected into the cavity to form a protective body 66 over the die, the die pad, and the leads to seal and protect them from the environment. The plastic body 66 of the resulting semiconductor package 68 completely envelopes the leadframe 10 such that it surrounds the locking pads 40, the bonding pads 42, and the recessed shoulder 44 on the lower surface of the die pad and interlocks with them to resist delamination between the body and the leadframe. The rectangular frame 14 (shown dotted in FIG. 7) of the leadframe 10 is exposed outside of the lateral periphery of the body 66, and is subsequently cut away from the body and discarded in a finishing operation to leave the outer ends 70 of the locking pads 40 exposed through the side surfaces 72 of the package 68 (see FIG. 8). The central portion 46 of the lower surface of the die pad 22 and the rectangular lands 48 on the lower surfaces of the leads 16 are exposed through the lower surface 74 of the body 66 (see FIG. 9) for their subsequent attachment to a PCB 76, as illustrated in the cross-sectional view of FIG. 7. The mounting and interconnection lands 48 and the exposed central portion 46 of the die pad 22 can be attached and electrically connected to the PCB by a solder joint, or, in a low-temperature attachment, by a layer 78 of a filled, electrically and thermally conductive adhesive.

Figure 8:
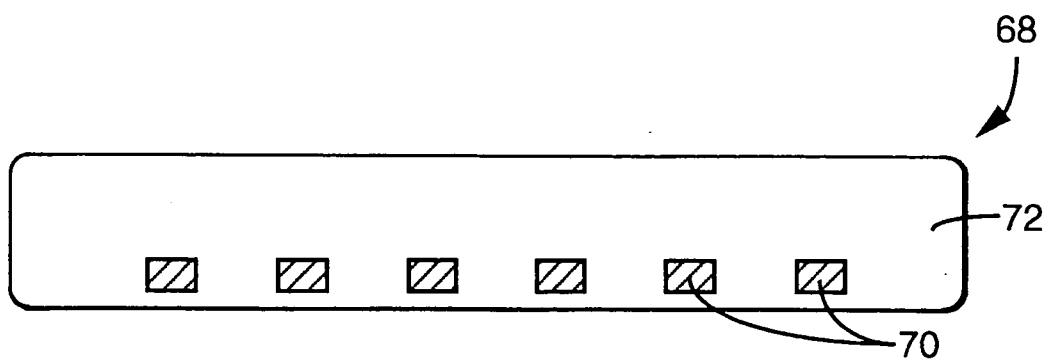
FIG. 8 is a side elevation view of the semiconductor package shown in FIG. 7; and, FIG. 9 is a bottom plan view of the semiconductor package shown in FIGS. 7 and 8.
Figure 9:
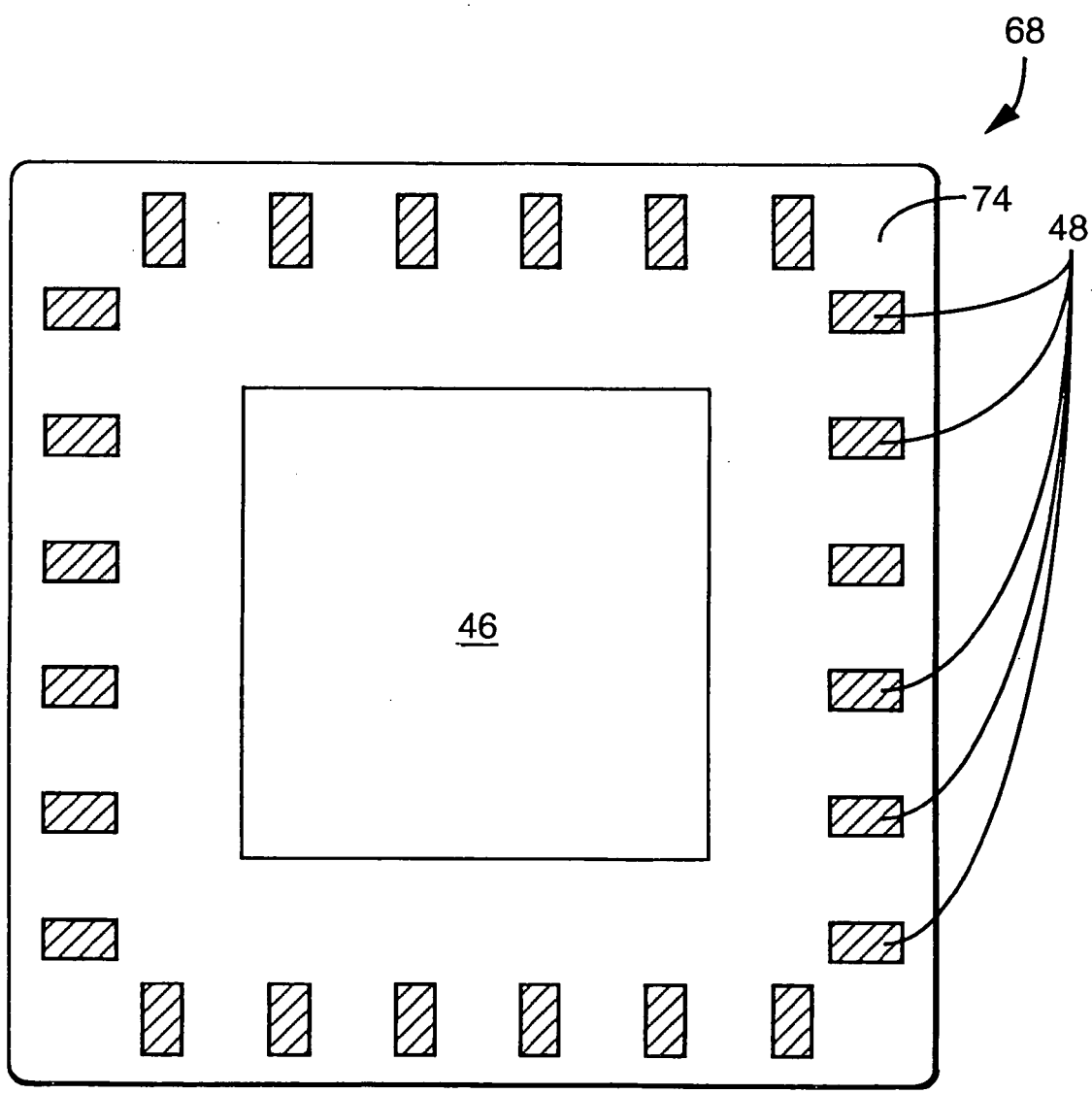

The thin, small outline, LGA semiconductor package 68 incorporating the coined leadframe 10 of the invention and shown in FIGS. 7–9 is about 4 mm on a side, and about 1 mm thick.

Those skilled in the packaging art will understand that many variations of the particular embodiments of the novel leadframe and package illustrated and described herein are possible, depending on the particular problem at hand. For example, although a square package 68 is illustrated in the figures, a rectangular or polygonal package is easily confected in accordance with teachings herein. Similarly, fewer or greater numbers of leads 16 can be incorporated into the package, on either two, or all sides thereof. Further, the leads 16 can be extended outside of the body 66 of the package 68 and the lands 48 over-molded with plastic to yield a package with peripheral leads, such as those found in a conventional "quad-flat" package.

Accordingly, the particular embodiments illustrated and described herein should be understood as exemplary in nature only, and not as limitations on the scope of the invention, which is defined instead by that of the claims appended hereafter.

What is claimed is:

1. A semiconductor package, comprising:
   a metal lead frame, including a plurality of elongate leads arrayed around a central region thereof, each lead having a generally planar upper surface, an outer end portion extending away from the central region and defining an outer end, an inner end portion extending toward the central region, and a middle portion extending between the outer and inner end portions, the middle portion being of a lead width and having a lower surface which defines a land;
   a spatulate bonding pad formed in the inner end portion of each lead and having a bonding pad width which exceeds the lead width, the bonding pad being partially defined by the upper surface of the lead and including a lower bonding pad surface positioned between the upper surface of the lead and the lower surface of the lead which defines the land; and
   a die pad attached to the lead frame in the central region thereof and adjacent to the inner end portions of the leads, the die pad having an upper surface and a lower surface; and
   a body of an insulative plastic molded over the die, the die pad, and the leads such that the plastic body surrounds the bonding pads and interlocks with them, and such that the lands are exposed in and substantially flush with a lower surface of the body and the outer ends of the leads are exposed in and substantially flush with a side surface of the body.

2. The semiconductor package of claim 1, wherein the die pad is attached to the frame by at least one tie-bar.

3. The semiconductor package of claim 1, wherein the die pad is attached to at least one of the leads by at least one tie-bar.

4. The semiconductor package of claim 3, wherein each of the bonding pads has a generally circular configuration.

5. The semiconductor package of claim 1, wherein the lands are rectangular.

6. The semiconductor package of claim 1, further comprising:
   a semiconductor die attached to the upper surface of the die pad; and
   a plurality of conductive wires bonded at opposite ends to pads on a top surface of the die and selected ones of the bonding pads on the leads.

7. The semiconductor package of claim 1, wherein the lower surface of the die pad has a central portion and a recessed shoulder extending around the central portion, and the plastic body surrounds the recessed shoulder such that the central portion of the lower surface of the die pad is exposed in the lower surface of the body.

8. The semiconductor package of claim 1, wherein the leadframe comprises an alloy of copper, aluminum, or iron and nickel.

9. The semiconductor package of claim 1, wherein the insulative plastic of the body comprises an epoxy resin.

10. A lead frame for a semiconductor package, comprising:
- a plurality of elongate metal leads arrayed around a central region, each lead having a generally planar upper surface, an outer end portion extending away from the central region, an inner end portion extending toward the central region, and a middle portion extending between the outer and inner end portions, the middle portion being of a lead width and having a lower surface which defines a land;
- a spatulate bonding pad formed into the inner end portion of each of the leads, the spatulate bonding pad of each of the leads having a pad width which exceeds the lead width, the bonding pad being partially defined by the upper surface of the lead and including a lower bonding pad surface positioned between the upper surface of the lead and the lower surface of the lead which defines the land; and
- a disposable frame connected to the leads.

11. The lead frame of claim 10, further comprising a die pad disposed in the central region and adjacent the inner end portions of the leads, the die pad having a recessed shoulder extending around a periphery of a lower surface thereof.

12. The semiconductor package of claim 10, wherein the lands are rectangular.

13. A semiconductor package of a type that includes a metal lead frame having a plurality of elongate leads radiating out from a central die pad, each lead having a generally planar upper surface and a lower surface which defines a land, a semiconductor die mounted on the die pad, a plurality of wire bonds connecting the die to the leads, and a protective plastic body molded over the leads, the die pad, the die, and the wire bonds, the improvement in combination therewith comprising:
- a spatulate bonding pad formed into an inner end portion of each lead and adjacent to the die pad, the bonding pad having a bonding pad width, the bonding pad being partially defined by the upper surface of the lead and including a lower bonding pad surface positioned between the upper surface of the lead and the lower surface of the lead which defines the land; and
- the bonding pad width exceeding a lead width of a middle portion of each lead extending between the inner and outer end portions thereof, with the leads, the die pad and the bonding pads having coplanar upper surfaces.

14. The semiconductor package of claim 13, wherein the wire bonds are connected to the bonding pads.

15. The semiconductor package of claim 13, wherein the middle portion of each lead has a lower surface defining a land which is exposed through a lower surface of the plastic body.

16. The semiconductor package of claim 15, wherein the lands are rectangular.

17. The semiconductor package of claim 13, further comprising a recessed shoulder formed into a periphery of a lower surface of the die pad such that a central portion of the lower surface inside of the shoulder is exposed through a lower surface of the plastic body.

* * * * *